(12) United States Patent
Krauska

(10) Patent No.: US 11,385,272 B2
(45) Date of Patent: Jul. 12, 2022

(54) MILLIMETER WAVE MATERIAL TEST SYSTEM

(71) Applicant: Tektronix, Inc., Beaverton, OR (US)

(72) Inventor: Alexander Krauska, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 128 days.

(21) Appl. No.: 16/892,071

(22) Filed: Jun. 3, 2020

(65) Prior Publication Data

US 2020/0386801 A1 Dec. 10, 2020

Related U.S. Application Data

(60) Provisional application No. 62/859,650, filed on Jun. 10, 2019.

(51) Int. Cl.
*G01R 27/28* (2006.01)
*G01R 29/08* (2006.01)
*G01R 31/00* (2006.01)
*G01R 29/10* (2006.01)

(52) U.S. Cl.
CPC ..... *G01R 29/0835* (2013.01); *G01R 29/0878* (2013.01); *G01R 29/10* (2013.01); *G01R 31/003* (2013.01)

(58) Field of Classification Search
CPC ............... G01R 29/10; G01R 29/0878; G01R 29/0835; G01R 31/003; G01R 31/006; G01N 22/00; G01N 23/16; G01N 27/223
See application file for complete search history.

(56) References Cited

U.S. PATENT DOCUMENTS

| 5,691,474 A | * | 11/1997 | Gerz | G01B 17/02 |
| | | | | 73/159 |
| 2015/0355109 A1 | * | 12/2015 | Bayram | G01N 22/00 |
| | | | | 324/602 |
| 2016/0187266 A1 | * | 6/2016 | Annan | G01N 22/00 |
| | | | | 324/640 |
| 2019/0008422 A1 | * | 1/2019 | Leath | A61B 5/7235 |
| 2020/0049751 A1 | * | 2/2020 | Salazar Cerreno | H01Q 1/422 |

* cited by examiner

*Primary Examiner* — Thang X Le
(74) *Attorney, Agent, or Firm* — Miller Nash LLP; Andrew J. Harrington

(57) ABSTRACT

A test and measurement device measures an insertion loss of a material under test. The test and measurement device includes a reference device in contact with a first surface of a material under test, the reference device including a reflective component and an absorbing component. A testing device is in contact with a second surface of the material under test, opposite the first surface. The testing device includes a first transmitter to output a first signal at a predetermined frequency to the reflective component of the reference device through the material under test, a first receiver to receive a first reflected signal from the reflective component, a second transmitter output a second signal at the predetermined frequency to the absorbing component of the reference device through the material under test, and a second receiver to receive a second reflected signal from the material under test.

20 Claims, 4 Drawing Sheets

MILLIMETER WAVE MATERIAL TEST SYSTEM

PRIORITY

This disclosure claims benefit of U.S. Provisional Application No. 62/859,650, titled "MILLIMETER WAVE MATERIAL TEST SYSTEM," filed on Jun. 10, 2019, which is incorporated herein by reference in its entirety.

TECHNICAL FIELD

This disclosure is directed to systems and methods related to test and measurement systems, and in particular, to a millimeter wave material test system including a test and measurement instrument for testing materials for radar transmission and reflectivity.

BACKGROUND

Many vehicles now include advanced driver assistance systems (ADAS) such as autonomous emergency braking and lane change assist. These advanced driver assistance systems often involve using radar to detect whether other vehicles or other objects are present and/or slowing down in front of the current vehicle. Radar is used by emitting radio waves and receiving a reflection of the radio waves off a surface of an object to determine a range, angle, and relative velocity of objects. Traditionally, many radar systems have used frequencies in the 24 GHz band, but many new vehicles are using frequencies in the 77 GHz band.

Different components of vehicles can sometimes interact with and/or block the emitted frequency of the radar and therefore various components of the vehicle have to be tested to ensure that they adequately emit and receive frequencies in these desired bands. Traditionally, to test these systems, a coaxial cabled system is used. However, coaxial cables that can handle frequencies in the 77 GHz band are often very expensive and fragile.

Embodiments of the disclosure address these and other deficiencies of the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

Disclosed herein is a millimeter wave materials testing unit, which may be handheld to assist in automotive manufacturing and automotive repair. The millimeter wave materials testing unit can test materials, such as, but not limited to, paint, coatings, bumpers, door panels, etc. for radar transmission and reflectivity. The millimeter wave materials testing unit may be used on the materials to ensure that a radar signal is adequately transmitting through, and/or reflecting from, the tested material.

Figure 1:
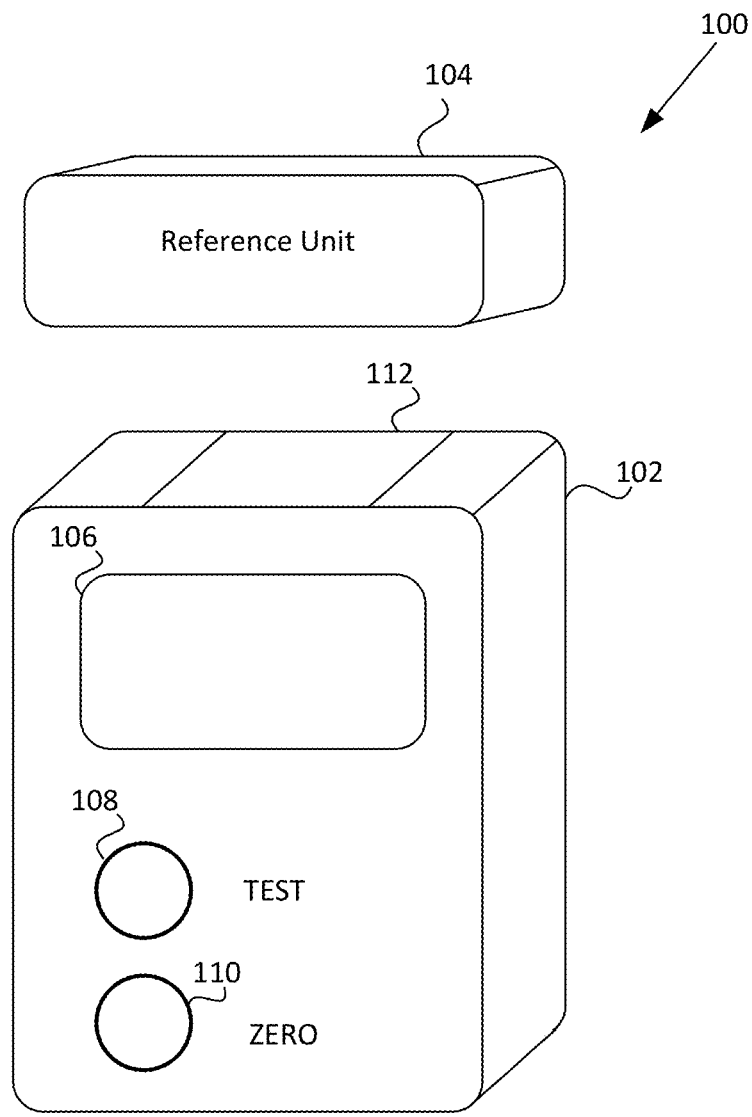
FIG. 1 is an illustration of an example millimeter wave material tester according to some embodiments of the disclosure.

FIG. 1 illustrates an example of a millimeter wave material tester 100 according to some embodiments of the disclosure. The millimeter wave material tester 100 can include a meter 102 and a reference unit 104. The meter can include a display 106 to output information to a user regarding the status of a test. The millimeter wave material tester 100 is a light and handheld device that can quickly test a material to ensure that the material allows radar transmission for a radar system, in particular an automotive radar system, to adequately operate. In some embodiments, the millimeter wave materials tester 100 may be battery powered.

The millimeter wave material tester 100 can also include one or more user inputs, which may include, for example, a button 108 to perform a test and a button 110 to perform a calibration. However, the one or more user inputs are not limited to the buttons 108 and 110 illustrated in FIG. 1 and can be any user inputs, such as, but not limited to, switches, joysticks, a touchscreen, a keyboard, etc.

The meter 102 also includes a transmitter and receiver surface 112 that interacts with a corresponding surface (not shown in FIG. 1) of the reference block 102 and/or the material under test. As will be understood by one skilled in the art, the meter 102 also includes a number of hardware components, such as, but not limited to, one or more processors, storage media, communication interfaces, power supplies, etc.

Figure 2:
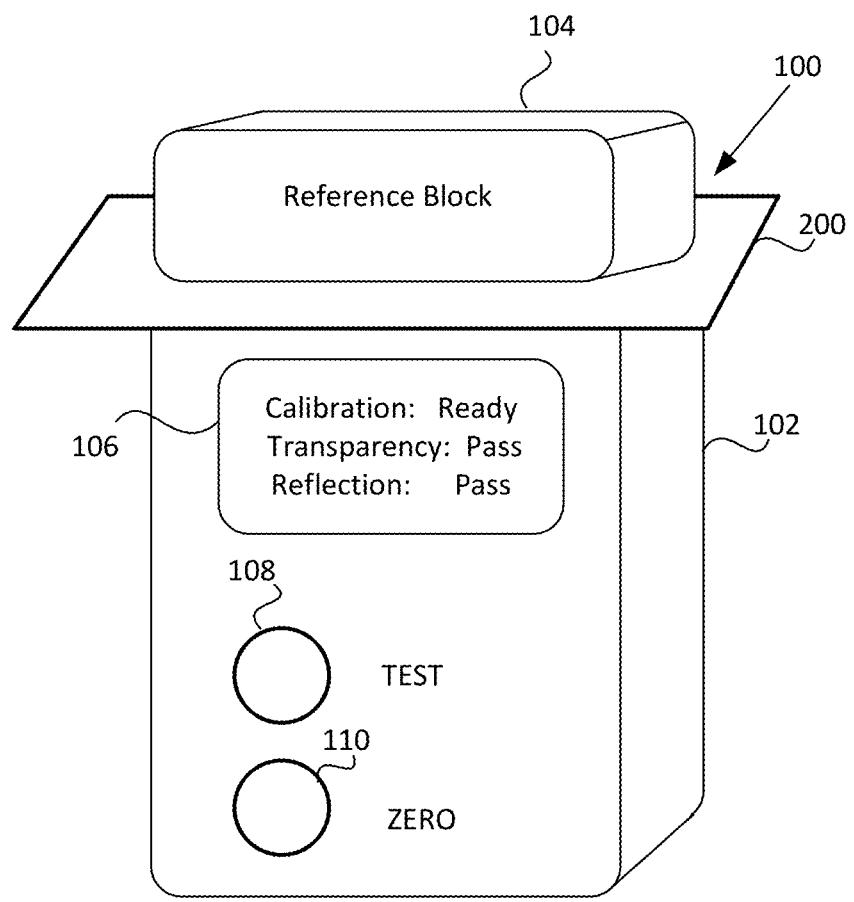
FIG. 2 is another illustration of the millimeter wave material tester of FIG. 1 during operation of the millimeter wave material tester.

FIG. 2 illustrates the millimeter wave material tester 100 being used to test a material 200. The material 200 is placed between the meter 102 and the reference unit 104. As will be discussed in more detail below, the surface 112 of the meter 102 and a corresponding surface of the reference unit 104 include an alignment mechanism to align the meter 102 and the reference unit 104 to each other through the material 200. The alignment mechanism may include, for example, magnets, a corresponding pin and hole in the surfaces 112 and 400, or any other mechanism to align the surfaces 112 and 300.

A user can select the test input 108 or otherwise instruct the meter 102 to test the material 200 between the meter 102 and the reference unit 102. Based on the outcome of the test, which will be discussed in more detail below, the display 106 can display relevant information to the user. For example, as shown in FIG. 2, the display 106 outputs that the material 200 passed a transparency and reflection test. Although the example display 106 outputs merely that the material passed or did not pass, embodiments of the disclosure are not limited to this summary output, and more information may be provided, such as a graphical representation of the transparency and reflection of the material.

Figure 3:
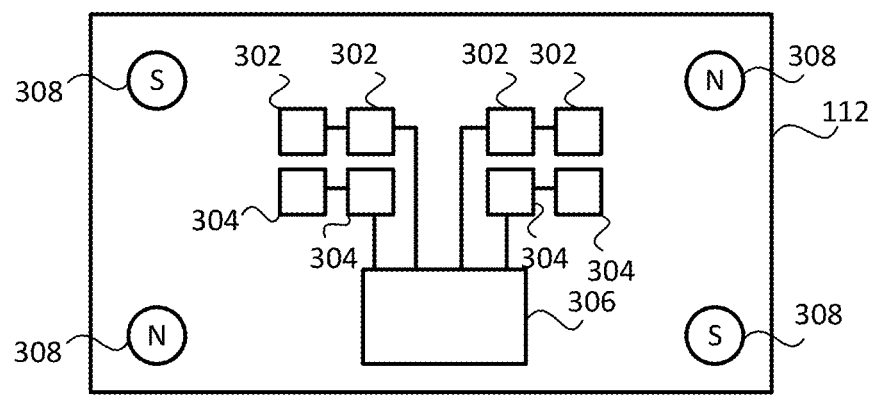
FIG. 3 is a block diagram of a surface of the millimeter wave material tester of FIG. 1.

FIG. 3 illustrates an example of a transmitter and receiver surface 112 of the meter 102 according to some embodiments of the disclosure. The transmitter and receiver surface 112 includes two transducer pairs. Each transducer pair consists of a transmitter pair 302 and a receiver pair 304. Each transducer pair can be separately activated. The receive and transmit sides can be arranged on the surface 112, which can be a printed circuit board, so that the net surface wave coupling, or the transmission in the plane of the surface 112, is zero, such as in a conventional antenna, and can be primarily sensitive to signals perpendicular to the surface 112.

Circuitry 306 is located on the edge of the transmitter and receiver surface 112. The circuitry 306 may be under a protective panel on the transmitter and receiver surface 112. The circuitry 306 may include, for example, a frequency modulated (FM) continuous wave (CW) chirp radar integrated circuit that can support multiple input and output channels. The transmitter 302 and receiver 306 antennas can be printed directly on the surface of the transmitter and receiver surface 112.

The transmitter and receiver surface 112 also includes an alignment mechanism. The alignment mechanism ensures that transmitter and receiver surface 112 aligns with a corresponding surface of the reference unit 104. In the embodiment illustrated in FIG. 3, the transmitter and receiver surface 114 can include a number of different magnets 308 that will attach to corresponding magnets of opposite polarity in the reference unit 104.

Figure 4:
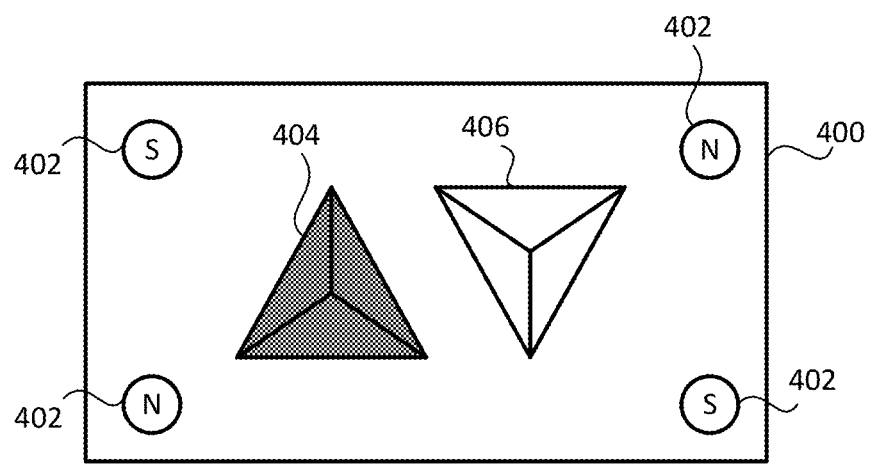
FIG. 4 is a block diagram of a surface of a reference component of the millimeter wave material tester of FIG. 1.

FIG. 4 illustrates an example surface 400 of a reference block 104. The surface 400 of the reference block 104 includes a corresponding alignment structure to align the transmitter and receiver surface 112 of the meter 102 to the surface 400 of the reference block 104. In FIG. 4, the alignment mechanism includes corresponding magnets 402 with opposite polarity to the magnets on the transmitter and receiver surface 112.

The surface 400 also includes an absorption or reflectionless component 404 and a reflection component 406. The absorption component 404 absorbs the transmitted radar to allow the meter 102 to determine what is reflected directly off the material 200 and the reflection component 406 reflects the signal back to the meter 102 to determine how well the material being tested is transmitting the signal.

The absorption component 404 can be any component and/or surface that absorbs a transmitted signal, while the reflection component 406 can be any component and/or surface that reflects a signal. In some embodiments, the reflection component 406 is a corner cube, which is a retroreflector consisting of three mutually perpendicular, intersecting flat surfaces that reflects waves directly back toward a source. Corner cubes are effective for a situation where a noncontact highly reflective, independent of angle and alignment, patch is required. A corner cube can allow an incoming signal to bounce across multiple surfaces of high reflectivity material, such as aluminum, silver, copper, etc., and return directly to the source, even when misaligned. Metallic surfaces, such as aluminum, with an oxide coating work well, since the oxide form is low loss and transmissive to the reflecting aluminum below the oxide coating.

A corner cube may be molded in a metal and then plated or, in some embodiments, the corner cube may be made of plastic and then plated. The exposed area of the corner cube may be covered with a dielectric film suspended across the surface, or the surface may be treated for protection, or may be allowed to oxidize naturally. Being a molded component, the corner cube is available at a relatively low cost and the outside edges or rear of the reference unit 104 can have significant draft angles or hollow space to reduce the cost of molding the reflection component 406.

In some embodiments, both the surfaces 112 and 400 are smooth and non-abrasive to allow the meter 102 and the reference unit 104 to slide along or across a material being tested without damaging the material, in order to test various portions of a large piece of material under test, such as an automobile bumper, for example.

Figure 5:
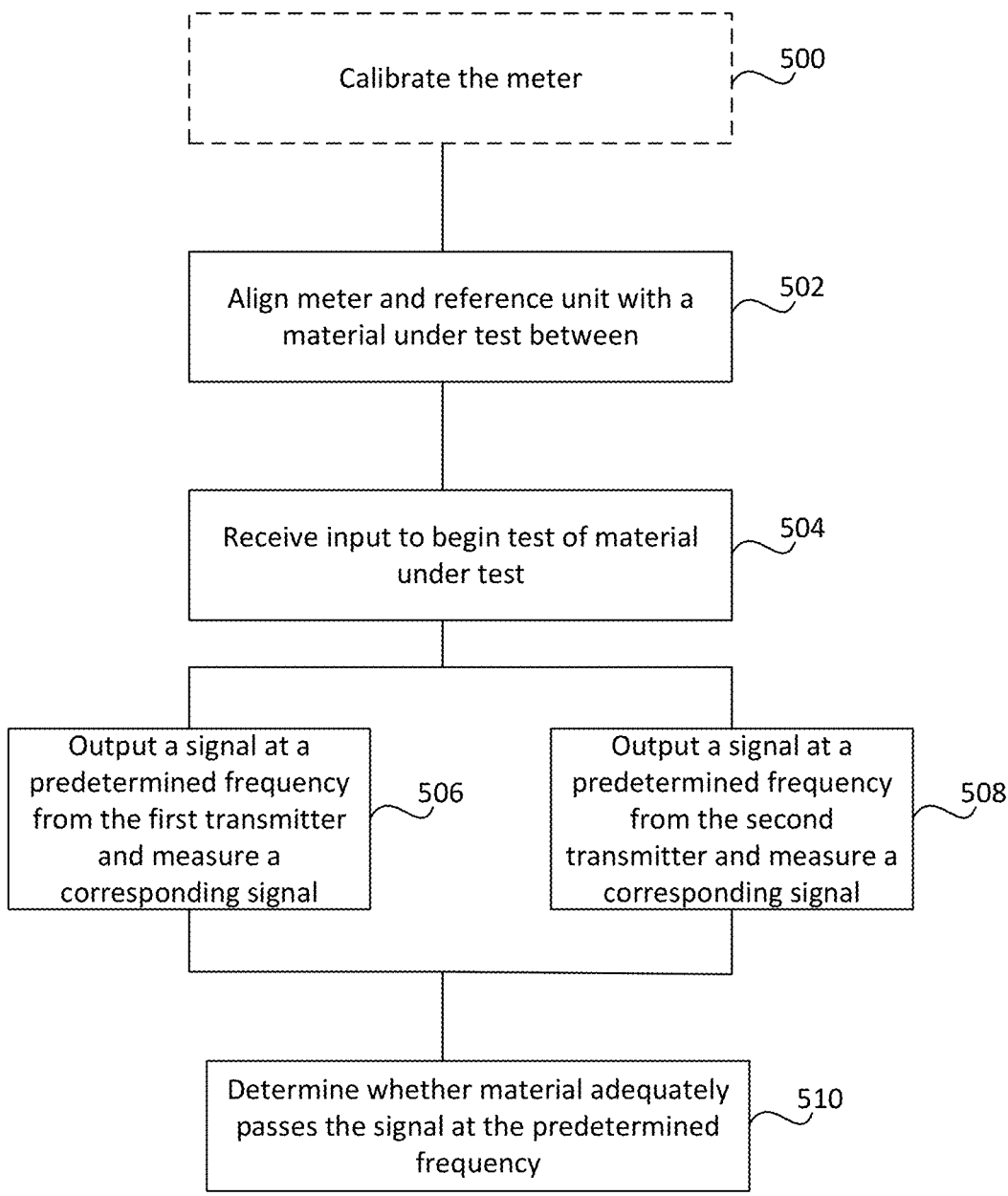
FIG. 5 is a flow chart illustrating an operation of the millimeter wave material tester of FIG. 1.

FIG. 5 is a flow chart illustrating an example operation of the millimeter wave material tester 100 according to some embodiments of the disclosure. Initially, in optional operation 500, a user may perform a calibration of the meter 102. To do this, a user may place the reference block 102 directly on the meter 102 so that the alignment mechanism of both the meter 102 and the reference block 102 align the transmitter and receiver surface 112 of the meter with the surface 400 of the reference block. The user may then select button 110 to calibrate or zero the meter 102.

In operation 502, a material being tested, such as material 200 discussed above, is placed between the meter 102 and the reference unit 104. The material 200 may be, for example, a fender or a car door panel. Since the material may be large, the alignment mechanisms of the surfaces 112 and 300 can ensure that the meter 102 and the reference unit 104 are aligned to take an accurate measurement of the material.

In operation 504, an input may be received from the meter 102 to conduct a test of the material under test. When the input to test the material is received, a transmitter 302 of a first transducer pair can output a signal at a predetermined frequency in operation 506 and the corresponding receiver 304 can measure a return signal. In operation 508, the transmitter 302 of the second transducer pair can output a signal at the predetermined frequency and the corresponding receiver 304 can measure the return signal. As mentioned above, one transmitted signal is output toward the absorbing component 404, so the return signal measured by the corresponding receiver 304 is any signal that is reflected off the material 200. The other signal transmitted at the predetermined frequency is output toward the reflection component 406, so the return signal measured by the corresponding receiver 304 is the reflected signal from the reflection component 406, plus any signal that reflected off the material 200. In some embodiments, the predetermined frequency may be adjustable. In some embodiments, the meter 102 may transmit and measure test signals at multiple discrete predetermined frequencies. In some embodiments, the meter 102 may sweep through a range of predetermined frequencies.

In operation 510, using the two returned signals, a processor in the meter 102 can determine whether the material 200 is adequately passing the signal at the predetermined frequency. In some embodiments, the processor in the meter 102 can determine the insertion loss of the material and whether the insertion loss is within an acceptable range. The insertion loss can be determined using any known method based on the transmitted signal and the received signal. The processor can either output a pass/fail output, as shown in FIG. 2, or the processor can output a more-detailed output, such as displaying a graphical response of the received signals at the predetermined frequency. The predetermined frequency may be selected by a user or may be stored in memory in the meter 102. The operation shown in FIG. 5 allows for the millimeter tester 100 to test materials, such as paints, coatings, bumpers, door panels, etc. for radar transmission and reflectivity and quickly output whether the material is passes the necessary radar for radar systems to work.

The reference unit 104 and the meter 102 may be separated from the material 200 and slid or moved across the material 200 to test another portion of the material. The alignment mechanism, such as magnets or a pin and hole mechanism, can ensure that the reference unit 104 and meter 102 are aligned for the next reading on the material 200.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 is a test and measurement device, comprising: a reference device structured to be in contact with a first surface of a material under test, the reference device including a reflective component and an absorbing component; and a testing device structured to be in contact with a second surface of the material under test, opposite the first surface, the testing device including: a first transmitter configured to output a first signal at a predetermined frequency to the reflective component of the reference device through the material under test, a first receiver configured to receive a first reflected signal from the reflective component, a second transmitter configured output a second signal at the predetermined frequency to the absorbing component of the reference device through the material under test, and a second receiver configured to receive a second reflected signal from the material under test.

Example 2 is the test and measurement device of Example 1, wherein the testing device further includes a processor configured to determine whether the material under test meets predetermined requirements based on the first signal, the second signal, the first reflected signal, and the second reflected signal.

Example 3 is the test and measurement device of Example 2, wherein the processor is further configured to determine whether the material under test passes a transmission standard based on the first reflected signal and to determine whether the material under test passes a reflection standard based on the second reflected signal.

Example 4 is the test and measurement device of Example 2 or 3, wherein the testing device further includes a display configured to output the determination of whether the material under test meets predetermined requirements.

Example 5 is the test and measurement device of any of Examples 1 through 4, further comprising an alignment mechanism configured to align a surface of the reference device with a surface of the testing device.

Example 6 is the test and measurement device of Example 5, wherein the alignment mechanism includes a magnet on the surface of the reference device and a complementary magnet on the surface of the testing device.

Example 7 is the test and measurement device of any of Example 1 through 6, wherein the reference device is further structured to be directly in contact with the testing device during a calibration operation.

Example 8 is the test and measurement device of Example 7, wherein the testing device includes an input to initiate the calibration operation.

Example 9 is the test and measurement device of any of Examples 1 through 8, wherein the first transmitter and the first receiver are a transducer pair including two first transmitters and two first receivers.

Example 10 is the test and measurement device of Example 9, wherein the second transmitter and the second receiver are a transducer pair including two second transmitters and two second receivers.

Example 11 is the test and measurement device of any of Examples 1 through 10, wherein the predetermined frequency is a frequency for an output of a signal of a radar system.

Example 12 is the test and measurement device of any of Examples 1 through 11, wherein the test and measurement device is handheld.

Example 13 is a method for measuring characteristics of a material under test, comprising transmitting a first signal at a predetermined frequency toward an absorbing component through a material; receiving a first response signal in response to the transmission of the first signal; transmitting a second signal at the predetermined frequency toward a reflective component through the material; receiving a second response signal in response to the transmission of the second signal; and determining an insertion loss of the material.

Example 14 is the method of Example 13, further including determining whether the insertion loss of the material meets predetermined requirements.

Example 15 is the method of Example 14, further comprising displaying the determination of whether the material under test meets predetermined requirements.

Example 16 is the method of any of Examples 13 through 15, further comprising aligning a surface of the reference device with a surface of the testing device by an alignment mechanism.

Example 17 is the method of Example 16, wherein the alignment mechanism includes a magnet on the surface of the reference device and a complementary magnet on the surface of the testing device.

Example 18 is the method of any of Examples 13 through 17, further comprising performing a calibration procedure by: transmitting the first signal at a predetermined frequency toward an absorbing component without the material; receiving a third response signal in response to the transmission of the first signal; transmitting the second signal at the predetermined frequency toward a reflective component without the material; and receiving a fourth response signal in response to the transmission of the second signal.

Example 19 is the method of any of Examples 13 through 18, wherein a first transmitter for transmitting the first signal and a first receiver for receiving the first response signal are a transducer pair including two first transmitters and two first receivers.

Example 20 is the method of any of Examples 13 through 19, wherein the predetermined frequency is a frequency for an output of a signal of a radar system.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

We claim:

1. A test and measurement device, comprising:
 a reference device structured to be in contact with a first surface of a material under test, the reference device including a reflective component and an absorbing component; and
 a testing device structured to be in contact with a second surface of the material under test, opposite the first surface, the testing device including:
  a first transmitter configured to output a first signal at a predetermined frequency to the reflective component of the reference device through the material under test,
  a first receiver configured to receive a first reflected signal from the reflective component,
  a second transmitter configured output a second signal at the predetermined frequency to the absorbing component of the reference device through the material under test, and
  a second receiver configured to receive a second reflected signal from the material under test.

2. The test and measurement device of claim 1, wherein the testing device further includes a processor configured to determine whether the material under test meets predetermined requirements based on the first signal, the second signal, the first reflected signal, and the second reflected signal.

3. The test and measurement device of claim 2, wherein the processor is further configured to determine whether the material under test passes a transmission standard based on the first reflected signal and to determine whether the material under test passes a reflection standard based on the second reflected signal.

4. The test and measurement device of claim 2, wherein the testing device further includes a display configured to output the determination of whether the material under test meets predetermined requirements.

5. The test and measurement device of claim 1, further comprising an alignment mechanism configured to align a surface of the reference device with a surface of the testing device.

6. The test and measurement device of claim 5, wherein the alignment mechanism includes a magnet on the surface of the reference device and a complementary magnet on the surface of the testing device.

7. The test and measurement device of claim 1, wherein the reference device is further structured to be directly in contact with the testing device during a calibration operation.

8. The test and measurement device of claim 7, wherein the testing device includes an input to initiate the calibration operation.

9. The test and measurement device of claim 1, wherein the first transmitter and the first receiver are a transducer pair including two first transmitters and two first receivers.

10. The test and measurement device of claim 9, wherein the second transmitter and the second receiver are a transducer pair including two second transmitters and two second receivers.

11. The test and measurement device of claim 1, wherein the predetermined frequency is a frequency for an output of a signal of a radar system.

12. The test and measurement device of claim 1, wherein the test and measurement device is handheld.

13. A method for measuring characteristics of a material under test, comprising:
 transmitting a first signal at a predetermined frequency toward an absorbing component of a reference device through the material under test;
 receiving a first response signal in response to the transmission of the first signal;

transmitting a second signal at the predetermined frequency toward a reflective component of the reference device through the material under test;

receiving a second response signal in response to the transmission of the second signal; and determining an insertion loss of the material under test based on the first response signal and the second response signal.

14. The method of claim 13, further comprising determining whether the insertion loss of the material meets predetermined requirements.

15. The method of claim 14, further comprising displaying the determination of whether the material under test meets predetermined requirements.

16. The method of claim 13, further comprising aligning a surface of the reference device with a surface of a testing device by an alignment mechanism.

17. The method of claim 16, wherein the alignment mechanism includes a magnet on the surface of the reference device and a complementary magnet on the surface of the testing device.

18. The method of claim 13, further comprising performing a calibration procedure by:

transmitting the first signal at a predetermined frequency toward the absorbing component without the material under test;

receiving a third response signal in response to the transmission of the first signal;

transmitting the second signal at the predetermined frequency toward the reflective component without the material under test; and receiving a fourth response signal in response to the transmission of the second signal.

19. The method of claim 13, wherein a first transmitter for transmitting the first signal and a first receiver for receiving the first response signal are a transducer pair including two first transmitters and two first receivers.

20. The method of claim 13, wherein the predetermined frequency is a frequency for an output of a signal of a radar system.

* * * * *